United States Patent [19]

Proebsting

[11] Patent Number: 5,216,297
[45] Date of Patent: Jun. 1, 1993

[54] LOW VOLTAGE SWING OUTPUT MOS CIRCUIT FOR DRIVING AN ECL CIRCUIT

[75] Inventor: Robert J. Proebsting, Los Altos Hills, Calif.

[73] Assignee: Intergraph Corporation, Huntsville, Ala.

[21] Appl. No.: 758,838

[22] Filed: Sep. 12, 1991

[51] Int. Cl.$^5$ ............... H03K 19/092; H03K 19/086
[52] U.S. Cl. ..................... 307/475; 307/455
[58] Field of Search ..................... 307/475, 455, 451

[56] References Cited

U.S. PATENT DOCUMENTS

| | | | |
|---|---|---|---|
| 4,437,171 | 3/1984 | Hudson et al. | 307/475 |
| 4,645,951 | 2/1987 | Uragami | 307/475 |
| 4,656,375 | 4/1987 | Lauffer et al. | 307/475 |
| 4,703,199 | 10/1987 | Ely | 307/475 |
| 4,782,251 | 11/1988 | Tsugaru et al. | 307/475 |

Primary Examiner—Edward P. Westin
Assistant Examiner—Richard Roseen
Attorney, Agent, or Firm—Townsend and Townsend Khourie and Crew

[57] ABSTRACT

The first current flowing terminal of a first MOS transistor is coupled to the first current flowing terminal of a second MOS transistor at a first voltage node; the first current flowing terminal of the third MOS transistor is coupled to a second current flowing terminal of the first MOS transistor at a first output node; the first current flowing terminal of a fourth MOS transistor is coupled to the second current flowing terminal of the second MOS transistor at a second output node; and the second current flowing terminal of the fourth MOS transistor is coupled to the second current flowing terminal of the third MOS transistor at a second voltage node. A transistor control unit is coupled to the gate terminals of the first, second, third and fourth MOS transistors for biasing the transistors for alternately flowing current through the first and fourth MOS transistors or through the second and third MOS transistors. The first output node is coupled to a first input terminal of an ECL circuit and a second transmission line is coupled to the second output node is coupled to a second input terminal of the ECL circuit. A source resistance is coupled between the first voltage node and a voltage source. The source resistance ensures that the voltage at the first and second output nodes do not exceed the saturation values of the driven ECL gates while simultaneously maintaining a strong differential signal across the first and second output nodes.

12 Claims, 2 Drawing Sheets 5,216,297

LOW VOLTAGE SWING OUTPUT MOS CIRCUIT FOR DRIVING AN ECL CIRCUIT

BACKGROUND OF THE INVENTION

This invention relates to electronic circuitry and, more particularly, to a MOS circuit for driving an ECL circuit.

FIG. 1 is a block diagram of a portion of a conventional computing system 10. Computing system 10 comprises a central processing unit (CPU) 14 for processing instructions and data, a cache memory 18 for storing pages of data for high speed access by CPU 14, and a floating point unit (FPU) 22 for performing arithmetic operations on floating point data from cache memory 18. CPU 14 communicates data to cache memory 18 over a CPU-cache bus 26 and receives data from cache memory 18 over a cache-CPU bus 30. FPU 22 also receives data from cache memory 18 over a cache-FPU bus 34 which is coupled to cache-CPU bus 30. CPU 14 communicates with FPU 22 over a CPU-FPU bus 38.

Since cache memory 18 is intended to provide high speed access to data, it should be constructed with circuit elements which respond quickly to the signals used to access the data. Emitter coupled logic (ECL) circuits often meet the performance requirements of such high speed applications, so they are often used in cache memory designs. FIG. 2 is a schematic diagram of a conventional ECL gate 42 which may be used alone or in conjunction with other circuitry to meet the needs of a particular high speed circuit. ECL gate 42 comprises a first bipolar transistor 46 and a second bipolar transistor 50. Emitters 52, 54 of transistors 46 and 50 are coupled together and through a resistor R3 to a ground potential. A collector 62 of transistor 46 is coupled to a voltage (and current) source $V_{CC}$ through a resistor R1. Similarly, a collector 66 of transistor 50 is coupled to $V_{CC}$ through a resistor R2. A base terminal 70 of transistor 50 is coupled to a reference voltage $V_{REF}$, and a base terminal 74 of transistor 46 is coupled to a control input voltage $V_{IN}$. In a differential ECL gate receiving a differential input voltage, the reference voltage $V_{REF}$ is the complement of the input voltage $V_{IN}$.

ECL gate 42 is controlled so that current always flows from $V_{CC}$, through transistor 46 or 50, and to ground. Which transistor 46 or 50 conducts the current depends upon the magnitude of $V_{IN}$ relative to $V_{REF}$. If $V_{IN}$ is positive relative to $V_{REF}$, then current flows through transistor 46, and if $V_{REF}$ is positive relative to $V_{IN}$, then current flows through transistor 50.

Current flow through either transistor 46 or transistor 50 causes a voltage drop of approximately 0.6 volts across resistors R1 or R2, respectively. For example, when current flows through transistor 46, the voltage at collector 62 is approximately $V_{CC}-0.6$ volts. Consequently, when $V_{IN}$ equals $V_{CC}-0.6$ volts, transistor 46 is on the edge of saturation. If $V_{IN}$ is greater than $V_{CC}-0.6$ volts, then transistor 46 is saturated, the base is forward biased with respect to the collector, and extra charge is stored in the base. Unfortunately, when a signal is supplied to the base terminal of a saturated transistor to turn the transistor off, the extra charge in the base must be dissipated before the transistor can turn off, and the delay may be unacceptable. Therefore, the driving circuit should prevent saturation by keeping $V_{IN}$ from going more positive than $V_{CC}-0.6$ volts. In a typical ECL circuit, $V_{CC}$ equals 0 volts and ground equals $-5$ volts. Thus, $V_{IN}$ should not be greater (more positive) than $-0.6$ volts.

In the computing circuit shown in FIG. 1, CPU 14 may be constructed with metal oxide semiconductor (MOS) circuit elements. FIG. 3 is a schematic diagram of a MOS circuit 80 for driving one or more ECL gates 42 shown generally as an ECL circuit 84. ECL circuit 84 may be a part of cache memory 18. MOS driver 80 includes PMOS transistors Q1, Q2, Q3, and Q4. Transistor Q1 has a gate terminal 88, a current flowing terminal 90, and a current flowing terminal 92. Similarly, transistor Q2 includes a gate terminal 94, a current flowing terminal 96, and a current flowing terminal 98. The current flowing terminal 92 of transistor Q1 is coupled to the current flowing terminal 98 of transistor Q2 at a first voltage node 100. First voltage node 100 is coupled to a voltage (and current) source $V_{CC}$ through a line 102. Gate terminal 88 of transistor Q1 is coupled for receiving control signals applied to a line 104 through inverters 106, 108, 110, and 112. Gate terminal 94 of transistor Q2 receives the control signals applied to line 104 through inverters 106, 114 and 116. The signal applied to gate terminal 88 is thus an inverted copy of the signal applied to gate terminal 94.

Transistor Q3 has a gate terminal 120, a current flowing terminal 124, and a current flowing terminal 128. Similarly, transistor Q4 has a gate terminal 130, a current flowing terminal 134, and an current flowing terminal 138. Current flowing terminal 128 of transistor Q3 is coupled to current flowing terminal 90 of transistor Q1 at a node 139. Similarly, current flowing terminal 1 38 of transistor Q4 is coupled to current flowing terminal 96 of transistor Q2 at a node 142. Current flowing terminals 124 and 134 are coupled together at a second voltage node 150 which, in turn, is coupled to a voltage $V_{CC}-2.0$ volts through a line 154. Gate terminal 120 of transistor Q3 receives the control signals applied to line 104 through inverters 106, 160, and 164. Gate terminal 130 of transistor Q4 receives the control signals applied to line 104 through inverters 106, 166, 170, and 174.

A transmission line T1 is coupled to node 142 and to the true input terminal of differential ECL circuit 84, whereas a second transmission line T2 is coupled to node 139 and to the complement input terminal of differential ECL circuit 84. The signals at nodes N1 and N2 may be used as the true and complement $V_{IN}$ signals for ECL gates 42 in ECL circuit 84. A terminating resistor $R_T$ is coupled between transmission line T1 and transmission line T2 for preventing reflections along transmission line T1 or transmission line T2. If the transmission lines have an impedance of 50 ohms, the correct value for $R_T$ to prevent reflections is 100 ohms, and this value will be assumed hereafter. Separate terminating resistors of 50 ohms (not shown) for each transmission line are sometimes used for this purpose as well.

In operation, either transistors Q1 and Q4 or transistors Q2 and Q3 are conducting at any given time. When transistors Q1 and Q4 are conducting, current flows along line 102, through transistor Q1, through transmission line T2, through termination resistor $R_T$, through transmission line T1, through transistor Q4, and through line 154. When transistors Q2 and Q3 are conducting, then current flows through line 102, through transistor Q2, through transmission line T1, through termination resistor $R_T$, through transmission line T2, through transistor Q3, and through line 154. In any event, current always flows through line 102, through node 100, to node 150, and through line 154, and complementary output signals appear at nodes 139 and 142.

FIG. 4 is a schematic diagram showing a resistor circuit 180 that is the equivalent of circuit 80 shown in FIG. 3. A resistor $RQ_{12}$ represents the resistance through either transistor Q1 or transistor Q2, depending on which transistor is conducting at the time. Similarly, a resistor $RQ_{34}$ represents the resistance through either transistor Q3 or transistor Q4, again depending upon which transistor is conducting. Given a voltage of $V_{CC}$ at the upper portion of the circuit and a voltage of $V_{CC}-2$ volts at the lower portion of the circuit, then the voltage drop across the series of resistances is equal to $-2$ volts. To limit the voltage at node N1 to $V_{CC}-0.6$ volts (to avoid saturating the ECL transistors as discussed above), and assuming $RQ_{12}$ equals $R_{34}$ equals R, then the required resistance of transistors Q1-Q4 may be determined by solving the equation $R/(2R+100)\times(-2)$ volts $= -6$ volts. That is, the resistance R of each transistor Q1-Q4 should be 75 ohms or greater.

It is common for the resistance of transistors to vary by up to a factor of 4, depending on operating voltage, temperature, process variations during manufacture, etc. Thus, a transistor having a minimum resistance of 75 ohms, to satisfy the maximum 0.6 volt requirement, may have a maximum resistance of 300 ohms. Such a resistance still satisfies the $-0.6$ volt limitation at node N1, but then the total voltage swing across resistor $R_T$ is only approximately 0.28 volts, which provides a very weak differential signal across nodes N1 and N2. A desirable voltage swing is approximately 0.6 volts or more. If the transistors are designed to provide a 0.6 volt swing when the transistors are weak (high resistance), then, when the transistors are strong (low resistance) the voltage at node N1 would rise above the $-0.6$ volt maximum, thus saturating the ECL transistors.

SUMMARY OF THE INVENTION

The present invention is directed to a MOS driver for an ECL circuit which avoids saturating the driven ECL circuit elements while maintaining a strong differential output signal for both weak or strong MOS transistors. In one embodiment of the present invention, first, second, third and fourth MOS transistors each have a gate terminal, a first current flowing terminal, and a second current flowing terminal. The first current flowing terminal of the first MOS transistor is coupled to the first current flowing terminal of the second MOS transistor at a first voltage node; the first current flowing terminal of the third MOS transistor is coupled to the second current flowing terminal of the first MOS transistor at a first output node; the first current flowing terminal of the fourth MOS transistor is coupled to the second current flowing terminal of the second MOS transistor at a second output node; and the second current flowing terminal of the fourth MOS transistor is coupled to the second current flowing terminal of the third MOS transistor at a second voltage node. A transistor control unit is coupled to the gate terminals of the first, second, third and fourth MOS transistors for biasing the transistors for alternately flowing current through the first and fourth MOS transistors or through the second and third MOS transistors.

A first transmission line is coupled to the first output node, and a second transmission line is coupled to the second output node. A terminating resistance is coupled to the first transmission line and to the second transmission line for preventing signal reflections on the first transmission line and the second transmission line. The first transmission line is coupled to a first input terminal of an ECL circuit element, and the second transmission line is coupled to a second input terminal of the ECL circuit element. The signals on the first and second transmission lines are used for driving the gates in the ECL circuit element.

A source resistance is coupled between the first voltage node and a voltage source. The source resistance ensures that the voltage at the first and second output node do not exceed the saturation values of the driven ECL gates while simultaneously maintaining a strong differential signal across the first and second output nodes.

DESCRIPTION OF PREFERRED EMBODIMENTS

Figure 1:
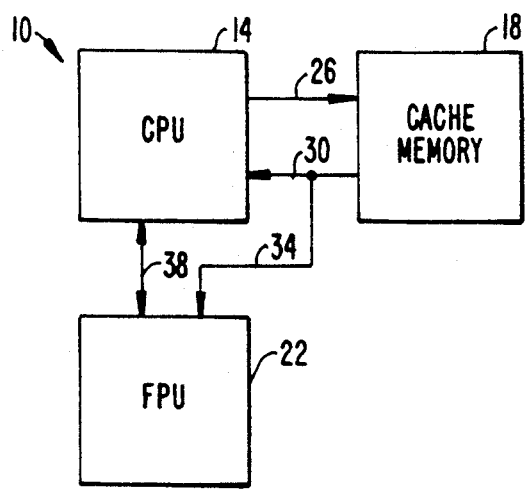
FIG. 1 is a block diagram of a conventional computing system.
Figure 2:
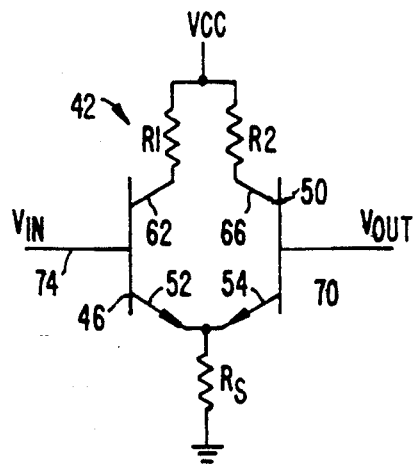
FIG. 2 is a schematic diagram of a typical ECL gate circuit.
Figure 3:
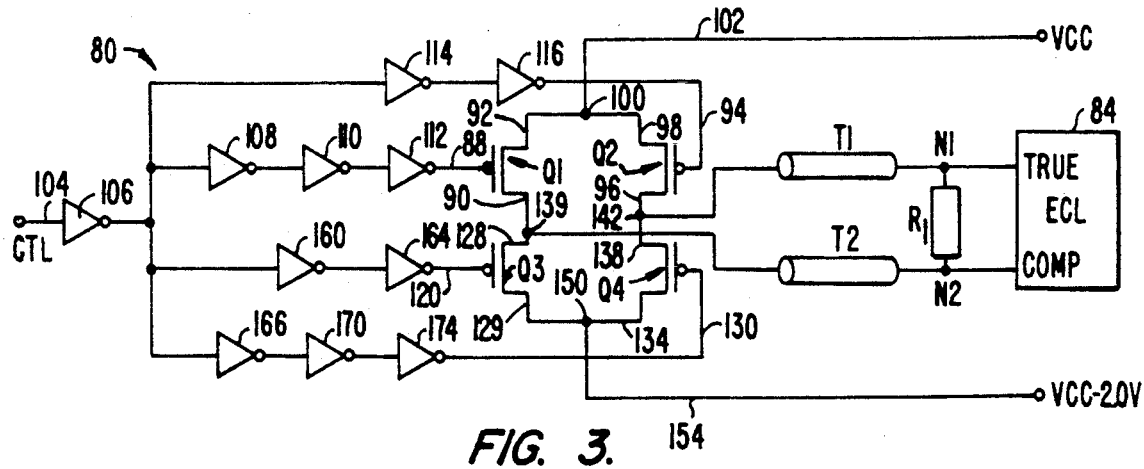
FIG. 3 is a schematic diagram of a MOS circuit for driving an ECL circuit.
Figure 5:
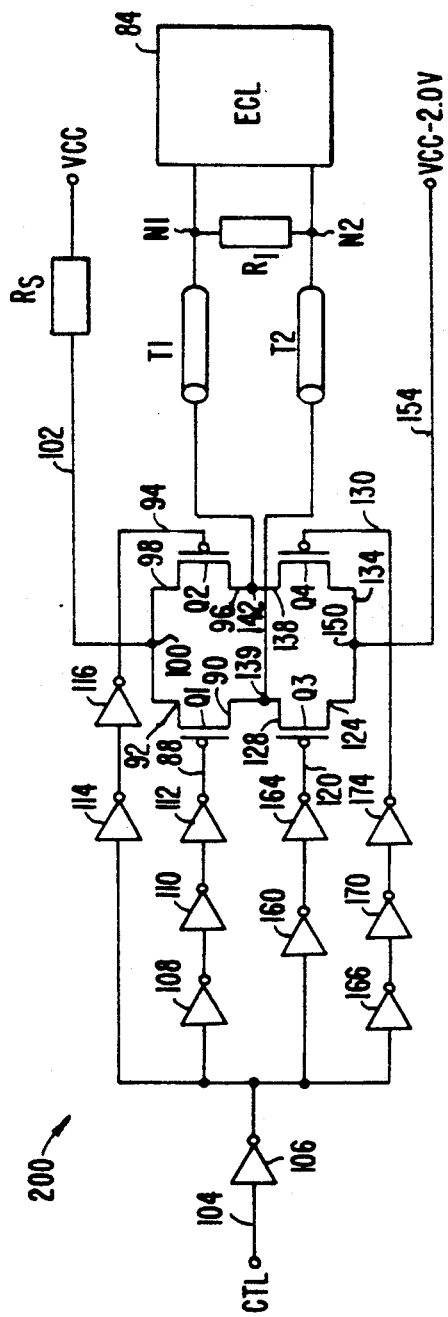
FIG. 5 is a schematic diagram of a particular embodiment of a MOS circuit according to the present invention for driving an ECL circuit.

FIG. 5 is a schematic diagram of a particular embodiment of a MOS driver 200 according to the present invention for driving ECL circuit 84. The components which are the same as circuit 80 of FIG. 3 are numbered the same. In this embodiment, a source resistance $R_S$ is disposed between voltage (current) source $V_{CC}$ and node 100 so that current flows through source resistance $R_S$ whenever current flows through transistors Q1 and Q2.

Figure 4:
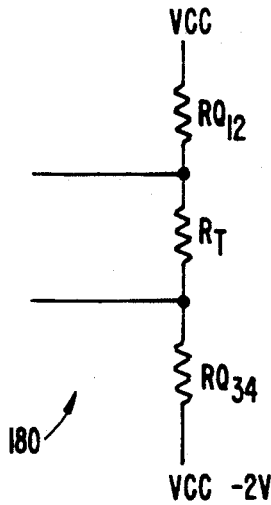
FIG. 4 is a schematic diagram of an equivalent resistance circuit corresponding to the circuit shown in FIG. 3.
Figure 6:
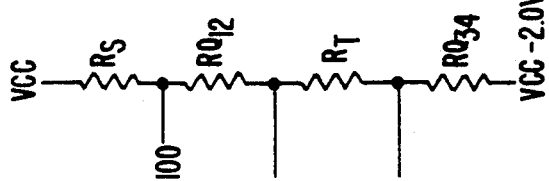
FIG. 6 is a schematic diagram of an equivalent resistance circuit corresponding to the circuit shown in FIG. 5.

FIG. 6 is a schematic diagram of an equivalent resistance circuit corresponding to the circuit shown in FIG. 5. The elements which are the same as those shown in FIG. 4 are labeled the same. As shown, source resistance $R_S$ (e.g., a resistor) is connected in series with resistances $RQ_{12}$, $R_T$, and $RQ_{34}$. Assuming a source resistance ($R_S$) value of 50 ohms, and a termination resistance $R_T$ value of 100 ohms, then the resistance of transistors Q1-Q4 may be 0 ohms and the voltage at node N1 still meets the upper voltage limit of $-0.6$ volts to avoid saturating the ECL transistors. Thus, transistors having any resistance value may be used without exceeding the upper voltage limit (assuming $RQ_{12}$ is about equal to $RQ_{34}$).

Now assume transistors having an expected resistance value of 25 ohms each are used for transistors Q1-Q4. If so, then the voltage at node 100 is approximately $-0.5$ volts, the voltage at node N1 is approximately 31 0.75 volts, and the voltage at node N2 is approximately $-1.75$ volts. The voltage at node N1 is not more positive than the $-0.6$ volt maximum, and the total voltage swing across resistor $R_T$ (and nodes N1 and N2) is approximately 1 volt.

Assuming a worst case resistance variation by a factor of 4 for all transistors, then the maximum resistance of transistors Q1-Q4 is approximately 100 ohms. In that case, the voltage at node 100 is approximately −0.29 volts, the voltage at node N1 is approximately −0.6 volts, and the voltage at node N2 is approximately −1.43 volts. The upper voltage limit of −0.6 volts at node N1 is maintained, and the total voltage swing across resistor $R_T$ is approximately −0.57 volts.

In either case, source resistance $R_S$ ensures that saturation of the driven ECL transistors is avoided while maintaining a strong differential signal across nodes N1 and N2.

It should be noted that source resistance $R_S$ functions as a negative feedback element so that if transistors Q1-Q4 are strong (e.g., a resistance value of approximately 25 ohms), then the supply voltage at node 100 is relatively low (approximately −0.5 volts). However, if transistors Q1-Q4 are weak (e.g., a resistance value of approximately 100 ohms), then the supply voltage at node 100 is higher (−0.29 volts).

While the above is a complete description of a preferred embodiment of the present invention, various modifications may be employed. For example, a plurality of MOS driver circuits may be coupled in parallel using a single source resistance $R_S$. In that case, the source resistance $R_S$ would be adjusted to meet the requirements of the parallel circuits. In the case of five driver circuits, the original 50 ohm source resistance would be replaced by a 10 ohm source resistance. Consequently, the scope of the invention should be ascertained by the claims.

What is claimed is:

1. A circuit for driving an ECL circuit comprising:
   a first transistor having a control terminal and a first current flowing terminal coupled to a first output node;
   a second transistor having a control terminal and a first current flowing terminal coupled to a second output node;
   transistor control means, coupled to the control terminal of the first transistor and to the control terminal of the second transistor, for biasing the first transistor and the second transistor so that complementary signals are provided at the first output node and the second output node;
   a resistance coupled in series with the first current flowing terminal of the first transistor and the first current flowing terminal of the second transistor; and
   wherein the resistance is connected so that current flow through the resistance whenever current flows through either the first current flowing terminal of the first transistor or through the first current flowing terminal of the second transistor.

2. The circuit according to claim 1 further comprising:
   a first transmission line coupled to the first output node;
   a second transmission line coupled to the second output node; and
   a terminating resistance coupled to the first transmission line and to the second transmission line for preventing signal reflections on the first transmission line and the second transmission line.

3. The circuit according to claim 2 wherein the first transmission line is coupled to a first input terminal of an ECL circuit, and wherein the second transmission line is coupled to a second input terminal of the ECL circuit.

4. A circuit for driving an ECL circuit comprising:
   a first transistor having a control terminal, a first current flowing terminal and a second current control terminal;
   a second transistor having a control terminal, a first current flowing terminal and a second current control terminal;
   wherein the first current flowing terminal of the first transistor is coupled to the first current flowing terminal of the second transistor at a first voltage node;
   a third transistor having a control terminal, a first current flowing terminal and a second current flowing terminal;
   wherein the first current flowing terminal of the third transistor is coupled to the second current flowing terminal of the first transistor at a first output node;
   a fourth transistor having a control terminal, a first current flowing terminal and a second current control terminal;
   wherein the second current flowing terminal of the fourth transistor is coupled to the second current flowing terminal of the second transistor at a second voltage node;
   wherein the first current flowing terminal of the fourth transistor is coupled to the second current flowing terminal of the third transistor at a second output node;
   a resistance coupled between the first voltage node and a current source; and
   transistor control means, coupled to the control terminal of the first transistor, to the control terminal of the second transistor, to the control terminal of the third transistor and to the control terminal of the fourth transistor for biasing the first transistor, the second transistor, the third transistor and the fourth transistor for alternately flowing current through the first transistor and the fourth transistor or through the second transistor and the third transistor.

5. The circuit according to claim 4 wherein the transistor control means, the first transistor, the second transistor, the third transistor, and the fourth transistor are coupled so that current flows from the first voltage node to the second voltage node whenever current flows through the first transistor and the fourth transistor or through the second transistor and the third transistor.

6. The circuit according to claim 5 wherein the resistance is connected so that current flows through the resistance whenever current flows either through the first transistor and the fourth transistor or through the second transistor and the third transistor.

7. The circuit according to claim 6 further comprising:
   a first transmission line coupled to the first output node;
   a second transmission line coupled to the second output node; and
   a terminating resistance coupled to the first transmission line and to the second transmission line for preventing signal reflections on the first transmission line and the second transmission line.

8. The circuit according to claim 7 wherein the first transmission line is coupled to a first input terminal of an ECL circuit, and wherein the second transmission line is coupled to a second input terminal of the ECL circuit.

9. An MOS circuit for driving an ECL circuit comprising:
   a first MOS transistor having a gate terminal, a first current flowing terminal, and a second current flowing terminal;
   a second MOS transistor having a gate terminal, a first current flowing terminal, and a second current flowing terminal;
   wherein the first current flowing terminal of the first MOS transistor is coupled to the first current flowing terminal of the second MOS transistor at a first voltage node;
   a third MOS transistor having a gate terminal, a first current flowing terminal, and a second current flowing terminal;
   wherein the first current flowing terminal of the third MOS transistor is coupled to the second current flowing terminal of the first MOS transistor at a first output node;
   a fourth MOS transistor having a gate terminal, a first current flowing terminal, and a second current flowing terminal;
   wherein the first current flowing terminal of the fourth MOS transistor is coupled to the second current flowing terminal of the second MOS transistor at a second output node;
   wherein the second current flowing terminal of the fourth MOS transistor is coupled to the second current flowing terminal of the third MOS transistor at a second voltage node;
   a first resistance coupled between the first voltage node and a current source;
   transistor control means, coupled to the gate terminal of the first MOS transistor, to the gate terminal of the second MOS transistor, to the gate terminal of the third MOS transistor, and to the gate terminal of the third MOS transistor, for biasing the first MOS transistor, the second MOS transistor, the third MOS transistor, and the fourth MOS transistor for alternately flowing current through the first MOS transistor and the fourth MOS transistor or through the second MOS transistor and the fourth MOS transistor.

10. The circuit according to claim 9 wherein the resistance is connected so that current flows through the resistance whenever current flows either through the first current flowing terminal of the first MOS transistor or through the first current flowing terminal of the second MOS transistor.

11. The circuit according to claim 9 further comprising:
   a first transmission line coupled to the first output node;
   a second transmission line coupled to the second output node; and
   a terminating resistance coupled to the first transmission line and to the second transmission line for preventing signal reflections on the first transmission line and the second transmission line.

12. The circuit according to claim 11 wherein the first transmission line is coupled to a first input terminal of an ECL circuit, and wherein the second transmission line is coupled to a second input terminal of the ECL circuit.

* * * * *